United States Patent [19]
Kazui et al.

[11] Patent Number: 5,551,148
[45] Date of Patent: Sep. 3, 1996

[54] METHOD FOR FORMING CONDUCTIVE BUMPS

[75] Inventors: Shinichi Kazui; Makoto Matsuoka; Hideyuki Fukasawa; Mitsunori Tamura; Mitsugu Shirai; Hideaki Sasaki, all of Hadano, Japan

[73] Assignee: Hitachi, Ltd., Japan

[21] Appl. No.: 330,569

[22] Filed: Oct. 28, 1994

[30] Foreign Application Priority Data

Oct. 28, 1993 [JP] Japan ..................... 5-270418

[51] Int. Cl.⁶ ..................... H05K 3/00
[52] U.S. Cl. ............ 29/843; 29/423; 228/180.22
[58] Field of Search .............. 29/423, 840, 843; 206/329, 330; 228/56.1, 245, 246, 253, 180.22

[56] References Cited

U.S. PATENT DOCUMENTS

| | | |
|---|---|---|
| 4,209,893 | 7/1980 | Dyce et al. |
| 4,664,309 | 5/1987 | Allen et al. ............ 228/180.22 |
| 4,705,205 | 11/1987 | Allen et al. ............ 228/180.22 |
| 4,906,823 | 3/1990 | Kushima et al. |
| 5,075,965 | 12/1991 | Carey et al. ............ 29/840 |
| 5,116,228 | 5/1992 | Kabeshita et al. .......... 29/840 X |

FOREIGN PATENT DOCUMENTS

| | | |
|---|---|---|
| 1-73625 | 3/1989 | Japan. |
| 2177642 | 1/1987 | United Kingdom. |

OTHER PUBLICATIONS

Denshi Zairyo, Nov. 1992, pp. 28–35.
Nikkei Electronics, Feb. 17, 1992, pp. 104–105.
IBM TDB vol. 32, No. 6B, Nov. 1989.
IBM Technical Disclosure Bulletin, Ball and Chip Placement Wafer, vol. 30, No. 7, Dec. 1987, pp. 124–125.

*Primary Examiner*—S. Thomas Hughes
*Attorney, Agent, or Firm*—Evenson, McKeown, Edwards & Lenahan, P.L.L.C.

[57] ABSTRACT

A flexible film-like member having conductive metals filled in tapered holes extending through the thickness is positioned such that the holes of the member face to respective pad patterns on a circuit board on which bumps are to be formed, the conductive metals are then heated and fused so that they are joined and transferred to the pad patterns on the circuit board, and the film-like member is then removed by heating or cleaning liquid.

2 Claims, 2 Drawing Sheets

FIG. IA
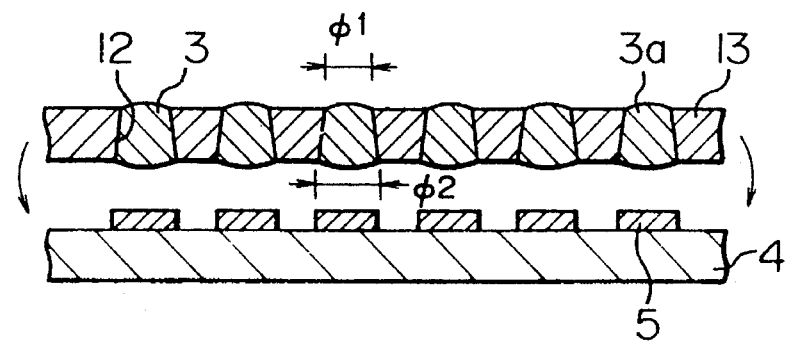
FIG. IB
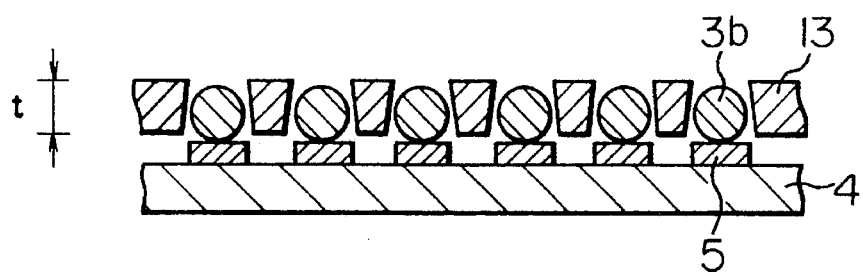
FIG. IC
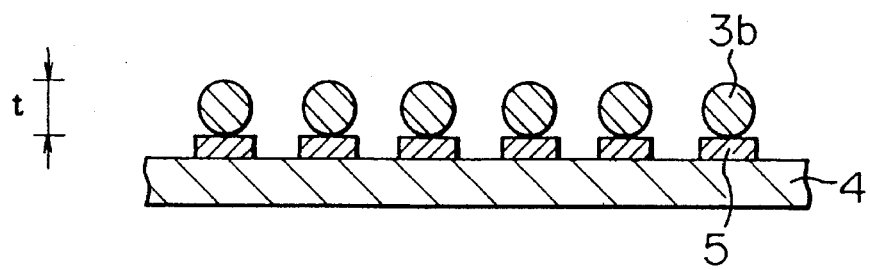
FIG. 2
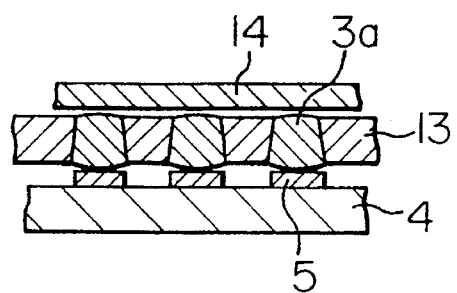

METHOD FOR FORMING CONDUCTIVE BUMPS

BACKGROUND OF THE INVENTION

The present invention relates to a method for forming conductive bumps on pad patterns on a circuit board when a device such as an LSI is packaged to the circuit board of an electronic unit of an electronic computer.

A method for forming conductive bumps of this type is disclosed in JP-A-1-73625 (Japanese Patent Application Serial No. 62-630406). As shown in a sectional view of FIG. 4, conductive metal balls 3 made of solder are sucked into recesses 2 formed thicknesswise of an alignment jig 1 to align thereto, and they are positioned such that the recesses 2 face to respective pad patterns 5 on a circuit board (or LSI) 4. Then, the conductive metal balls 3 are heated and fused to join and transfer the conductive metal balls 3 to the pad patterns 5, and the alignment jig 1 is removed to complete the circuit board (or LSI) 4.

DENSHI ZAIRYO, November 1992, p29, FIG. 1 and NIKKEI Electronics, Feb. 17, 1992, p105, FIG. 2 show similar methods.

Namely, as shown in FIG. 5, a film-like connector 7 having conductive metals (e.g. gold) 6 embedded at a predetermined interval are arranged between circuit boards 8 and 9, and the connector 7 is pressed by the circuit boards 8 and 9 to connect mating pad patterns 10 and 11 of the circuit boards 8 and 9.

flowever, in the method of forming the bumps shown in FIG. 4, the special alignment jig 1 is used to suck the conductive metal balls 3. Thus, it requires an air source and the work is troublesome and not efficient.

Further, in the method for forming the junction shown in FIG. 5, the circuit boards 8 and 9 are used while the film-like connector 7 is left. Thus, the connector 7 may interfere the arrangement of other parts.

SUMMARY OF THE INVENTION

It is an object of the present invention to provide a method for forming conductive bumps which allows efficient formation of the conductive bumps without interfering the arrangement of other parts.

In order to achieve the above object, in accordance with the present invention, a flexible film-like member having conductive metals filled in tapered holes extending through the thickness is positioned such that the holes of the member face to respective pad patterns on a circuit board on which bumps are to be formed, the conductive metals are then heated and fused so that they are joined and transferred to the pad patterns on the circuit board, and the film-like member is then removed by heating or cleaning liquid.

In general, Vapor furnace and reflow furance are used for heating and fusing.

The film-like member is positioned such that larger diameter sides of the tapered holes face to the pad patterns of the circuit board.

In accordance with the present invention, the film like member is positioned such that the holes of the member face the respective pad patterns on the circuit board on which the bumps are to be formed, and the conductive metals are then heated and fused to be joined and transferred to the pad patterns on the circuit board, and then the film-like member is removed by heating or the cleaning liquid.

Accordingly, the conductive bumps are formed efficiently without interfering the arrangement of other parts.

By positioning the film-like member such that the larger diameter sides of the tapered holes face to the pad patterns on the circuit board, the separation of the conductive metals from the film-like member is facilitated.

In accordance with the present invention, as described above, the flexible film-like member having the conductive metals filled in the tapered holes extending through the thickness is positioned such that the holes of the member face to the respective pad patterns on the circuit board on which bumps are to be formed, the conductive metals are then heated and fused so that they are joined and transferred to the pad patterns on the circuit board, and the film-like member is then removed by heating or cleaning liquid. Accordingly, the conductive bumps are formed efficiently at a high density without interfering the arrangement of other parts.

By positioning the film-lime member such that the larger diameter sides of the tapered holes face to the pad patterns on the circuit board, the separation of the conductive metals from the film-like member is facilitated and the joining is effectively made.

BRIEF DESCRIPTION OF THE DRAWINGS

FIGS. 1A to 1C illustrate a process in one embodiment of the method for forming the bumps in accordance with the present invention, FIG. 2 shows a process for pressurizing heated and fused conductive metals, FIG. 3 show a graph of a preferred example of a load to pressurize the heated and fused conductive metals.

DESCRIPTION OF THE PREFERRED EMBODIMENTS

Figure 3:
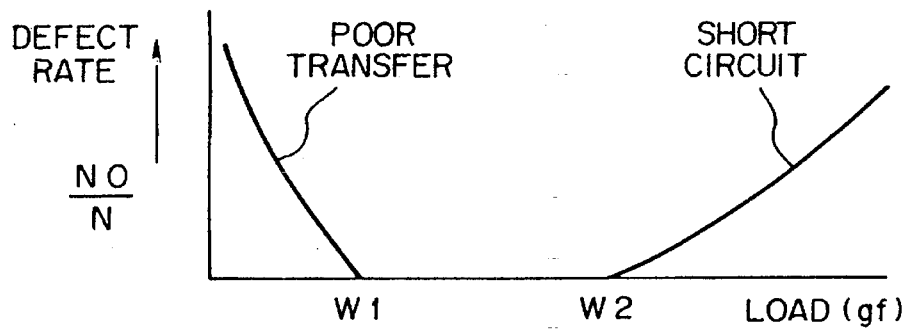
Figure 4:
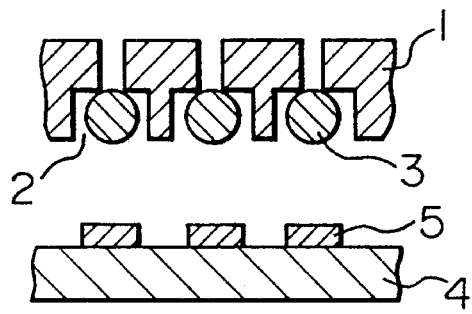
FIG. 4 shows an example of a prior art method for forming bumps.
Figure 5:
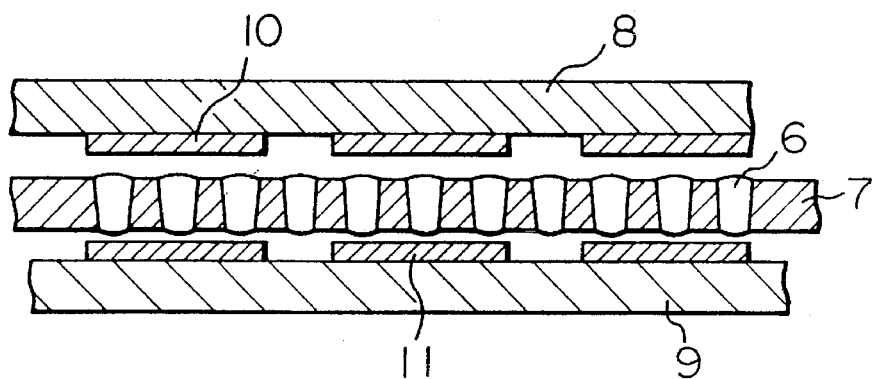
FIG. 5 shows an example of a prior art method for joining a circuit board.

FIGS. 1A to 1C show sectional views of one embodiment of the present invention. As shown in FIG. 1A, a flexible film-like member 13 having conductive metals 3a such as solder filled in tapered holes 12 extending through the thickness is prepared.

The film-like member 13 is made of a polyimide material, a material which sublimates by the heating of approximately same degree as a fusing temperature of the conductive metals 3a, or a material which is solved by cleaning liquid. The tapered hole 12 has a diameter of $\phi 1$ on the side facing away from the circuit board 4 and a diameter of $\phi 2$ on the opposite side where $\phi 2 > \phi 1$. The film-like member 13 may be mechanically peeled off The tapered holes 12 make use of the fact that the holes are always tapered when they are formed.

The film-like member 13 is then positioned such that, as shown in FIG. 1A, the holes 12 of the member 13 face to respective pad patterns 5 on a circuit board 4 on which the bumps are to be formed.

Then, the conductive metals 3a are heated and fused and they are pressed from the top of the film-like plate 13 by a pressurizing plate 14 as shown in FIG. 2 so that they are joined and transferred to the pad patterns 5 on the circuit board 4 as shown in FIG. 1B.

Then, as shown in FIG. 1C, the film-like member 13 is removed by heating or the cleaning liquid. When the film is removed by heating, it may be removed simultaneously with the fusing of the conductive metals 3a. The cleaning liquid may be hydrazine or ethylene diamine. After the use of the cleaning liquid, the assembly is usually washed by water.

In an example of the present embodiment, $\phi 1=0.2$ mm~0.3 mm, $\phi 2=0.21$ mm~0.32 mm, a thickness t of the film-like member 13 is 50 µm~170 µm, a pitch of the holes 12 is 0.3 mm~0.45 mm, the number of pad patterns 5 is 400 (20×20)~2500 (50×50), a diameter of the pad patterns 5 is 0.1 mm~0.25 mm, and the conductive metals 3a are made of solder of Sn/Pb=63/37. In this example, aligned bumps 3a were formed as shown in FIG. 1C. The dimensions shown above are mere examples and finer dimensions may be used.

When the fused conductive metals 3a are pressed toward the circuit board by the pressurizing plate 14, the transfer is not well performed if the pressing force is too low, and the bumps 3b are flattened if the force is too high.

Accordingly, the load toward the circuit board applied by the pressurizing plate 14 is preferably set in a range of W1~W2 (gf) to prevent poor joining and shortcircuit. In the embodiment, the pressurizing plate 14 is not used intentionally for heat transfer. Heating is performaed by reflow furnace.

By applying the load to the conductive metals 3a while taking the shape of the tapered holes 12 and the shape of the circuit board, the poor joining and the shortcircuit may be prevented.

By the poor joining it is meant that the conductive metals (solder) filled in the holes of the film are not joined and transferred to the pad patterns and left in the holes of the film, or not joined and transferred to the pad patterns although they are removed off.

By the shortcircuit defect, it is meant that the conductive metals are transferred to the pad patterns and joined and transferred thereto but shortcircuit (bridging) occurs between the pad patterns to cause electrical defects.

The pressurizing plate 14 is made of a material which is has no affinity to the conductive metals 3a, for example, a stainless steel plate or a ceramic plate for the solder conductive metals 3a.

What is claimed is:

1. A method for forming conductive bumps comprising the steps of:

preparing a circuit board, preparing a flexible film-like member having conductive metals filled in holes extending tapered from one side to another side thereof through the thickness thereof;

positioning said film-like member to said circuit board such that larger diameter sides of said tapered holes of said film-like member face respective pad patterns on said circuit board;

heating and fusing said conductive metals to transfer said conductive metals to said pad patterns on said circuit board to form conductive bumps; and removing said film-like member by heating said film-like member or solving said film-like member by cleaning liquid.

2. A method for forming conductive bumps according to claim 1 wherein said pad patterns are joined and transferred by applying a load to said heated and fused conductive metals toward said circuit board to prevent poor joining and shortcircuit.

* * * * *